(12) United States Patent  (10) Patent No.: US 8,896,319 B2
Liao et al.  (45) Date of Patent: Nov. 25, 2014

(54) LIGHT EMITTING DEVICE CONTROL CIRCUIT AND SHORT DETECTION CIRCUIT THEREOF

(75) Inventors: Chia-Wei Liao, Zhubei (TW); Ko-Cheng Wang, Puli Township, Nantou County (TW)

(73) Assignee: Richtek Technology Corporation, Chupei, Hsin-Chu (TW)

( * ) Notice: Subject to any disclaimer, the term of this patent is extended or adjusted under 35 U.S.C. 154(b) by 335 days.

(21) Appl. No.: 13/404,928

(22) Filed: Feb. 24, 2012

(65) Prior Publication Data

US 2013/0221978 A1    Aug. 29, 2013

(51) Int. Cl.
*G01R 31/02* (2006.01)
*G01R 31/12* (2006.01)

(52) U.S. Cl.
USPC .............. 324/537; 324/760.01; 324/762.01; 315/192

(58) Field of Classification Search
CPC .. G01R 31/281; G01R 31/024; G01R 31/041; G01R 31/315
USPC ...................... 324/537–760.02, 542; 315/192
See application file for complete search history.

(56) References Cited

U.S. PATENT DOCUMENTS

| | | | | |
|---|---|---|---|---|
| 6,888,454 | B2* | 5/2005 | Kurose | 340/514 |
| 7,876,103 | B2* | 1/2011 | Mihai et al. | 324/414 |
| 2010/0181941 | A1* | 7/2010 | Kuo et al. | 315/320 |
| 2012/0293082 | A1* | 11/2012 | Huang et al. | 315/192 |

* cited by examiner

*Primary Examiner* — Melissa Koval
*Assistant Examiner* — Emily Chan
(74) *Attorney, Agent, or Firm* — Tung & Associates

(57) ABSTRACT

A light emitting device control circuit controls a light emitting array which includes a plurality of light emitting device strings. Each light emitting device string includes a first terminal which is connected to a common node, a second terminal, and a plurality of light emitting devices connected in series. The light emitting device control circuit includes: a short detection circuit, coupled to the second terminals to receive second terminal signals from the second terminals, generating comparison signals according to whether the second terminal signals are higher than a reference signal, and generating a short detection signal according to whether a number of the comparison signals is between a first setting value and a second setting value.

7 Claims, 4 Drawing Sheets

| Number of the signals at the terminals B exceeding the reference signal | Short Detection Signal |
|---|---|
| not over the first setting value | Short detection signal is not generated |
| over the second setting value | Keep the previous signal status |
| between the first setting value and the second setting value | Short detection signal is generated |

LIGHT EMITTING DEVICE CONTROL CIRCUIT AND SHORT DETECTION CIRCUIT THEREOF

BACKGROUND OF THE INVENTION

1. Field of Invention

The present invention relates to a light emitting device control circuit and a short detection circuit thereof, in particular, to a light emitting device control circuit capable of detecting short circuit condition of light emitting devices and a short detection circuit for use therein.

2. Description of Related Art

FIG. 1 shows a schematic diagram of a typical power control circuit for driving LEDs (light emitting diodes). As shown in FIG. 1, the LED power control circuit 10 controls an LED array 20. The LED power control circuit 10 includes plural pins T11, T12, ..., T1n, which are respectively connected to the negative terminals B of the LED strings to receive current or voltage signals therefrom, for feedback controlling the LED array 20. The positive terminal A of each LED string is connected to the supply voltage Vout.

In general, in the LED power control circuit 10, whether a short circuit condition occurs in an LED string can be detected according to whether the voltage at the negative terminal B is higher than a preset reference value. When the voltage at the negative terminal B of the LED string is higher than the preset reference value, a short circuit condition is detected. However, if the LED power control circuit 10 provides a dimming function, misjudgment may occur in such short circuit detection. Referring to FIG. 2, a dimming circuit 11 generates a PWM dimming signal, which has a PWM duty that turns ON and OFF the LED strings in each period to adjust the brightness of the LED strings. When the PWM dimming signal does not turn ON an LED string, no current flows through the LED string, and therefore there is no voltage drop across the LED string; thus, the voltage at the negative terminal B the LED string is close to the supply voltage Vout and higher than the preset reference value, which will cause a misjudgment in short circuit detection. To accurately determine whether the LED string is in a short circuit condition, 100% PWM duty is needed. That is, for an LED power control chip 10 with dimming function, whether any LED string in the LED array 20 is short-circuited can only be detected when the LEDs are in the maximum brightness. Therefore, the prior art LED power control chip 10 only has very limited capability in detecting the short circuit condition; in most cases, it is unable to detect the short circuit condition of the LED array 20.

In view of the above drawback of the prior art, the present invention proposes a light emitting device control circuit and a short detection circuit for use therein, which are capable of detecting short circuit condition of light emitting devices under various dimming conditions.

SUMMARY OF THE INVENTION

An objective of the present invention is to provide a light emitting device control circuit; another objective of the present invention is to provide a short detection circuit thereof.

According to the above objectives, in one aspect, the present invention provides a light emitting device control circuit, controlling a light emitting array which includes a plurality of light emitting device strings, each light emitting device string having a first terminal and a second terminal and each light emitting device string including a plurality of light emitting devices connected in series, wherein the first terminals of the light emitting device strings are connected to a common node, the light emitting device control circuit comprising: a plurality of sensing nodes, respectively coupled to the second terminals of the light emitting device strings for receiving second terminal signals from the second terminals; and a short detection circuit coupled to the sensing nodes to receive the second terminal signals, for generating a plurality of comparison signals according to the second terminal signals and at least one reference signal, and generating a short detection signal by determining whether or not a number of the comparison signals having a predetermined level is between a first setting value and a second setting value, wherein the first setting value is equal to or larger than 1, the second setting value is equal to or less than a total number of the light emitting device strings minus 1, and the first setting value is less than the second setting value.

In another aspect, the present invention provides a short detection circuit for detecting a short circuit condition of a light emitting array, the light emitting array including a plurality of light emitting device strings, each light emitting device string having a first terminal and a second terminal and each light emitting device string including a plurality of light emitting devices connected in series, wherein the first terminals of the light emitting device strings are connected to a common node, the short detection circuit comprising: a signal comparison circuit, comparing a second terminal signal from each second terminal of the plurality of light emitting device strings and at least one reference signal to generate a plurality of comparison signals corresponding to the plurality of light emitting device strings; and a determining circuit coupled to the signal comparison circuit, for generating a short detection signal when a number of the comparison signals having a predetermined level is between a first setting value and a second setting value, wherein the first setting value is equal to or larger than 1, the second setting value is equal to or smaller than a total number of the light emitting device string minus 1, and the first setting value is smaller than the second setting value.

In an embodiment of the present invention, the short detection circuit further includes a short flag generation circuit. The short flag generating circuit generates respective short flags to indicate short circuit conditions of the light emitting device strings according to the short detection signal and the comparison signals.

The foregoing light emitting device control circuit preferably further includes a dimming circuit for generating a dimming signal which controls a brightness of light emitting array by turning ON and OFF the light emitting device strings. When the light emitting device strings are not turned ON, the short detection signal is not generated.

The objectives, technical details, features, and effects of the present invention will be better understood with regard to the detailed description of the embodiments below, with reference to the drawings.

DESCRIPTION OF THE PREFERRED EMBODIMENTS

Figure 1:
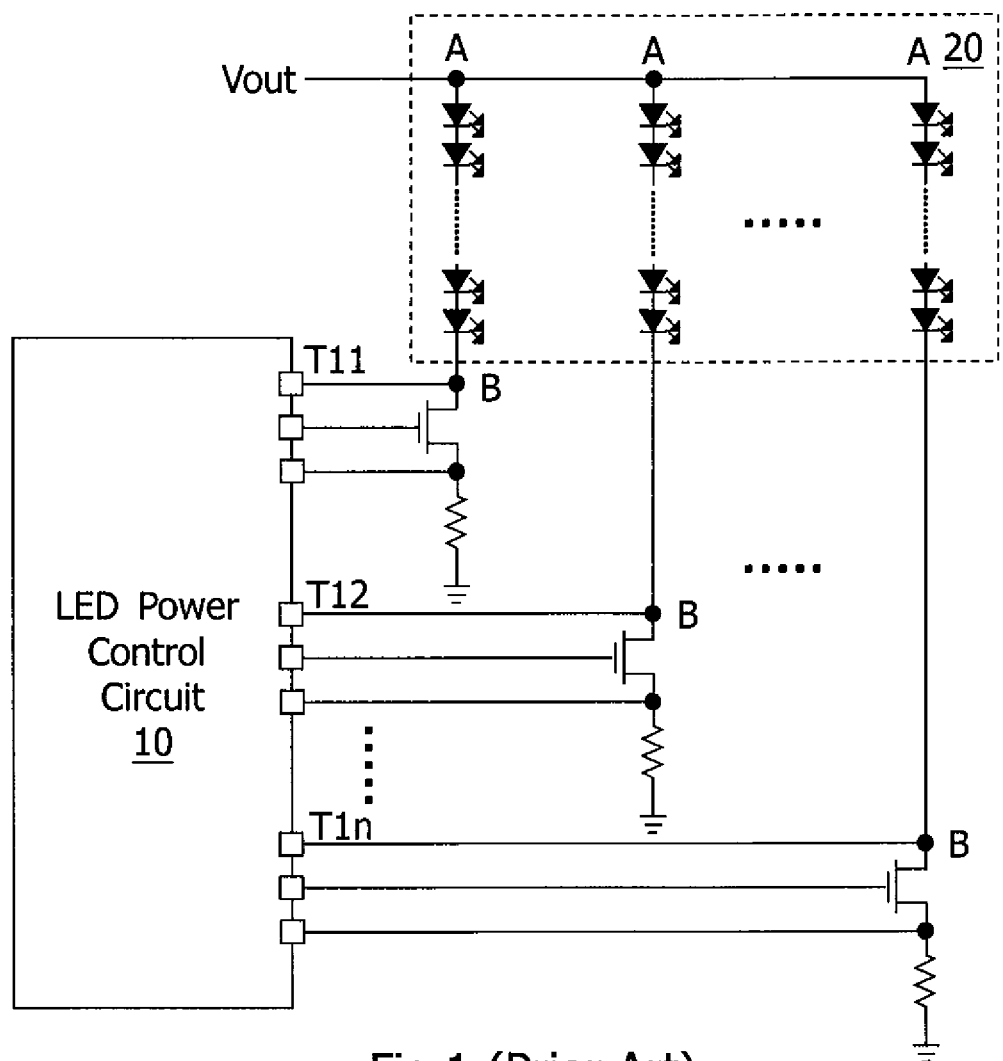
FIG. 1 shows a schematic diagram of a typical prior art LED power control circuit.
Figure 2:
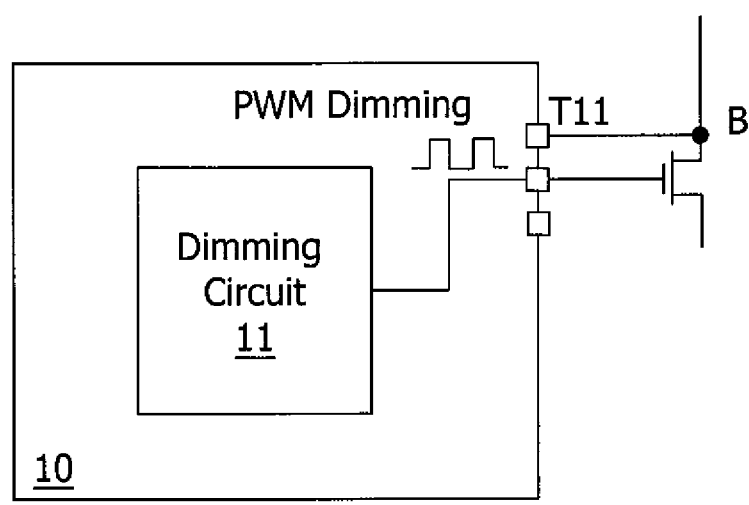
FIG. 2 shows an LED power control circuit 10 with dimming function.
Figures 3, 4:
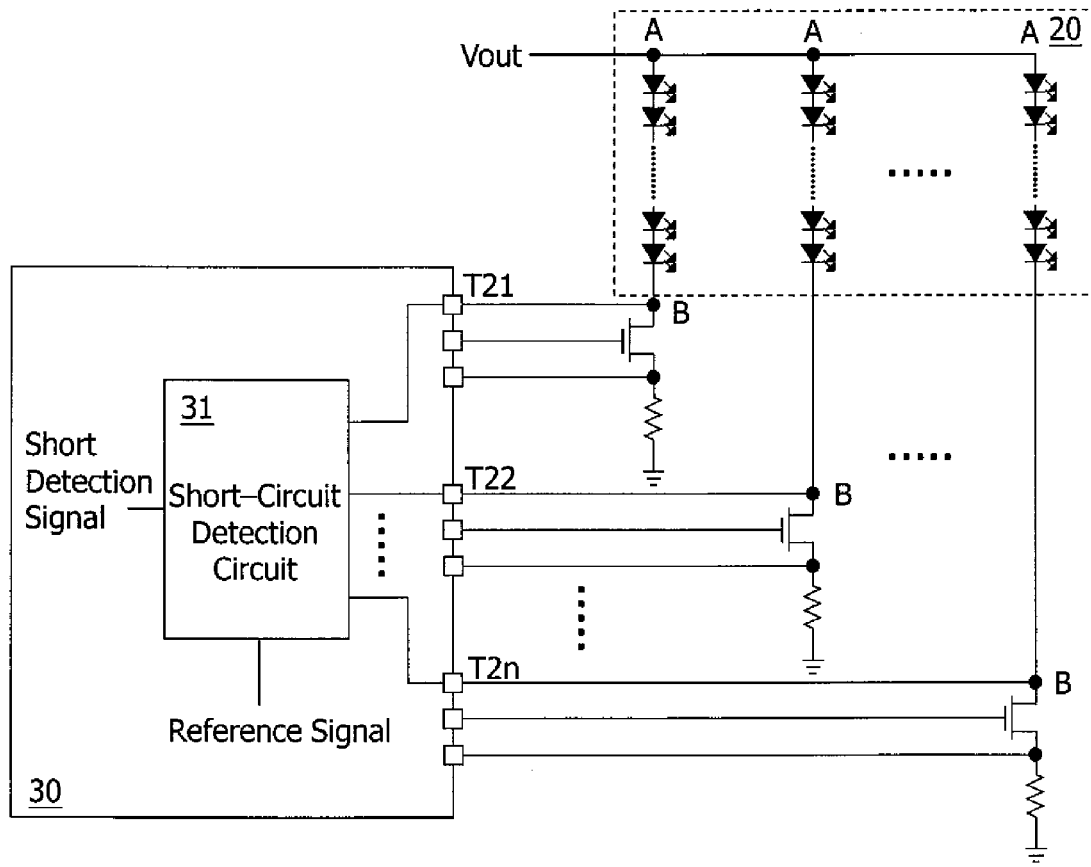
FIG. 3 and FIG. 4 show the first embodiment of the present invention.

FIG. 3 and FIG. 4 show the first embodiment of the present invention. As shown in FIG. 3, the light emitting device control circuit 30 is for controlling a light emitting device array, such as but not limited to the LED array 20 as shown. The LED array 20 includes a plurality of LED strings, wherein each LED string includes a plurality of LED devices connected in series, and each LED string includes a positive terminal A and a negative terminal B. Each positive terminal A is connected to a common node to receive a supply voltage Vout.

The light emitting device control circuit 30 includes plural sensing nodes T21, T22, T23, . . . , T2n, and a short detection circuit 31. The sensing nodes T21, T22, T23, . . . , T2n are respectively coupled to the negative terminals B of the LED strings, to receive the signals at the negative terminals B of the LED strings. The short detection circuit 31 is coupled to the sensing nodes T21, T22, T23, . . . , T2n to receive the signals at the negative terminals B of the LED strings. The signals at the negative terminals B for example are, but not limited to, voltage signals at the terminal B. The short detection circuit 31 generates a short detection signal according to the relations between the voltage signals at the terminals B and a reference signal.

Referring to FIG. 4, as an example, whether a short detection signal is generated to indicate a short circuit condition can be determined according to the number of the voltage signals at the negative terminals B which are higher than the reference signal. As shown in the figure, when the number of the voltage signals at the negative terminals B which are higher than the reference signal does not exceed a first setting value, the operation is determined to be normal and no short detection signal is generated ("no short detection signal is generated" means that the short detection signal is at a level which does not confirm a short circuit condition). When the number of the voltage signals at the negative terminals B which are higher than the reference signal exceeds a second setting value, the previous judgment is maintained and the short detection signal is kept at the same status as it is. When the number of the voltage signals at the negative terminals B which are higher than the reference signal is between the first setting value and the second setting value, a short circuit condition is determined and a short detection signal is generated. As an example, the first setting value can be set as 1, and the second setting value can be set as the total number of the light emitting device strings minus 1. In this case, when the number is at least one but less than the total number of the light emitting device strings, a short circuit condition is determined. The reason for the above settings is thus. When the circuit performs PWM dimming according to a dimming signal and is in the PWM off period, because all the LED strings are turned OFF, the number of the voltage signals at the negative terminals B which are higher than the reference signal is equal to the total number of the LED strings, and this means that we can not confirm the short circuit condition under such circumstance. However, if only part of the voltage signals of the LED strings are higher than the reference signal, we can confirm that a short circuit condition has occurred. Depending on the applications, the first setting value is not necessarily set to 1 but may be greater than 1; the second setting value does not have to be the total number of LED strings minus 1, but may be set to any other number which is less than the total number of LED strings.

Figure 5:
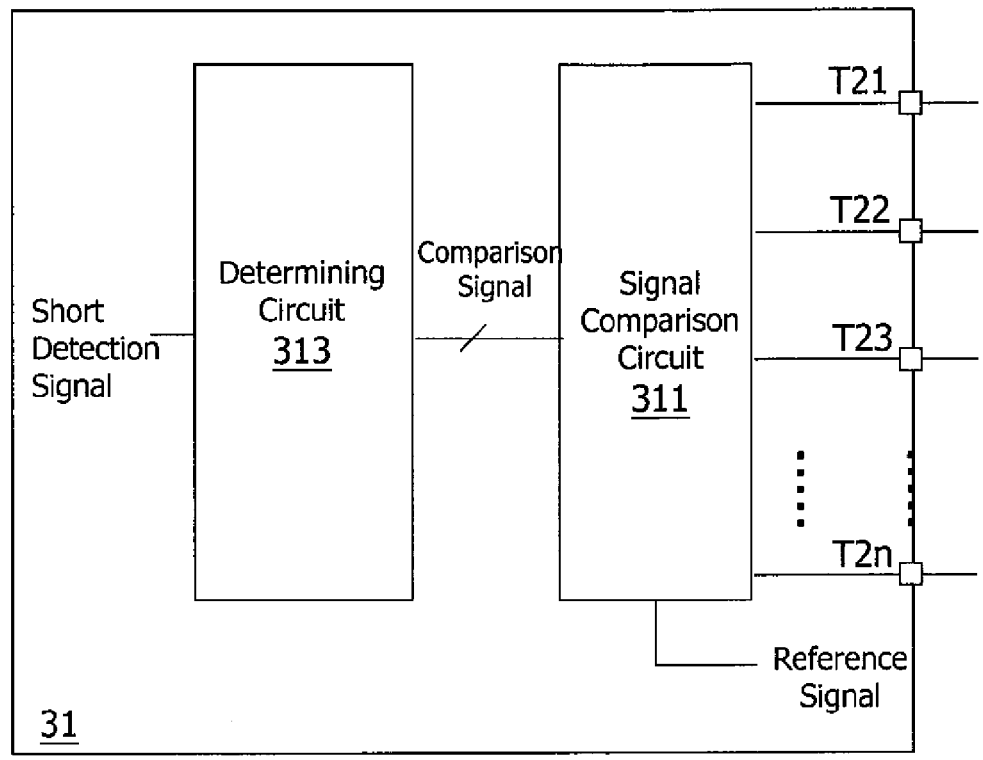
FIG. 5 shows the second embodiment of the present invention.

FIG. 5 illustrate the second embodiment of the present invention, wherein a more specific embodiment of the short detection circuit 31 is shown. As shown in FIG. 5, the short detection circuit 31 includes a signal comparison circuit 311 and a determining circuit 313. The signal comparison circuit 311 is coupled to the sensing nodes T21, T22, T23, . . . , T2n, to compare the signals at the negative terminals B of the light emitting device strings with the reference signal and generate a comparison signal based on the results of the comparison. The comparison signal can be either regarded as one multibit signal or plural comparison signals. The determining circuit 313 is coupled to the signal comparison circuit 311, and generates the short detection signal according to the number of the comparison signals (i.e., the number expressed by the multibit signal, or the number of the comparison signal/signals which has/have a predetermined level among the plural comparison signals).

Figure 6:
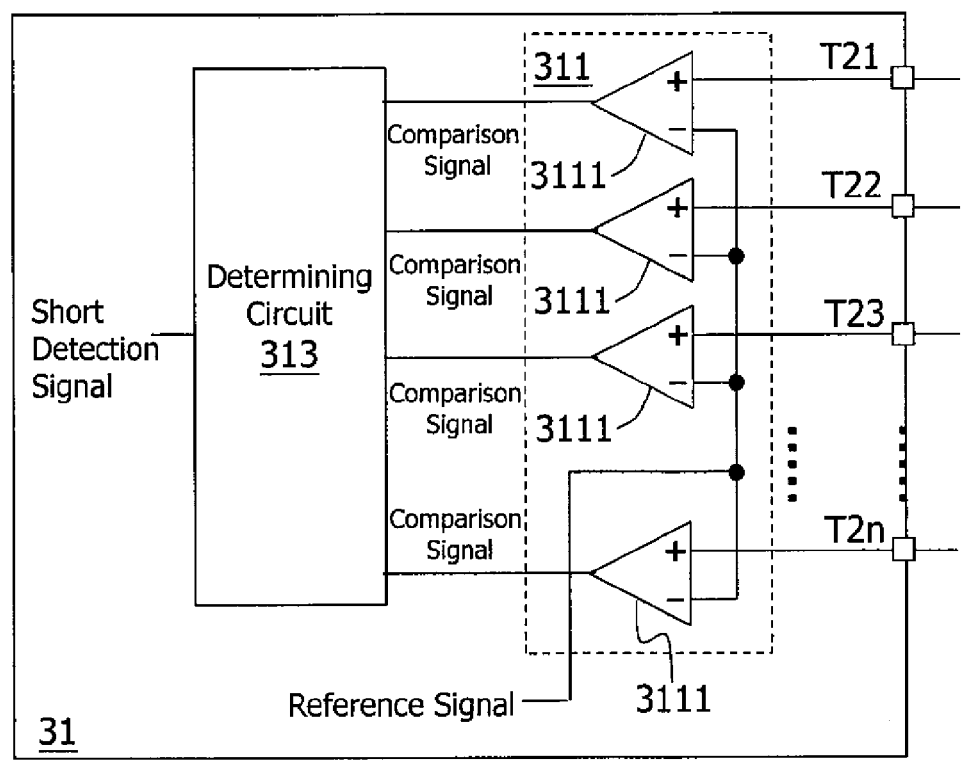
FIG. 6 shows the third embodiment of the present invention.

FIG. 6 shows the third embodiment of the present invention. This embodiment shows an even more specific embodiment of the short detection circuit 31. As shown in FIG. 6, the signal comparison circuit 311 includes plural comparators 3111, which are respectively coupled to the corresponding sensing nodes T21, T22, T23, . . . , T2n to respectively compare the signals at the terminals B of light emitting device strings and the reference signal, and generate comparison signals according to the comparison results. For example, when the signal at a corresponding negative terminal B of a light emitting device string is higher than the reference signal, a corresponding comparison signal is generated (i.e., a comparison signal having a predetermined level is generated). The determining circuit 313 is coupled to the signal comparison circuit 311; it counts the number of the comparison signals having the predetermined level to determine whether to generate a short detection signal.

An example how the determining circuit 313 determines whether to generate the short detection signal according to the number of the comparison signals is given below. For example, the determining circuit 313 can generate the short detection signal when the number of the comparison signal(s) is between 1 (included) and the total number of light emitting device strings minus 1 (included). Or, the first setting value and the second setting value may be set according to the design by a designer, and when the determining circuit 313 counts and finds that the number of comparison signal (s) is between the first setting value and the second setting value, the short detection signal is generated.

Figure 7:
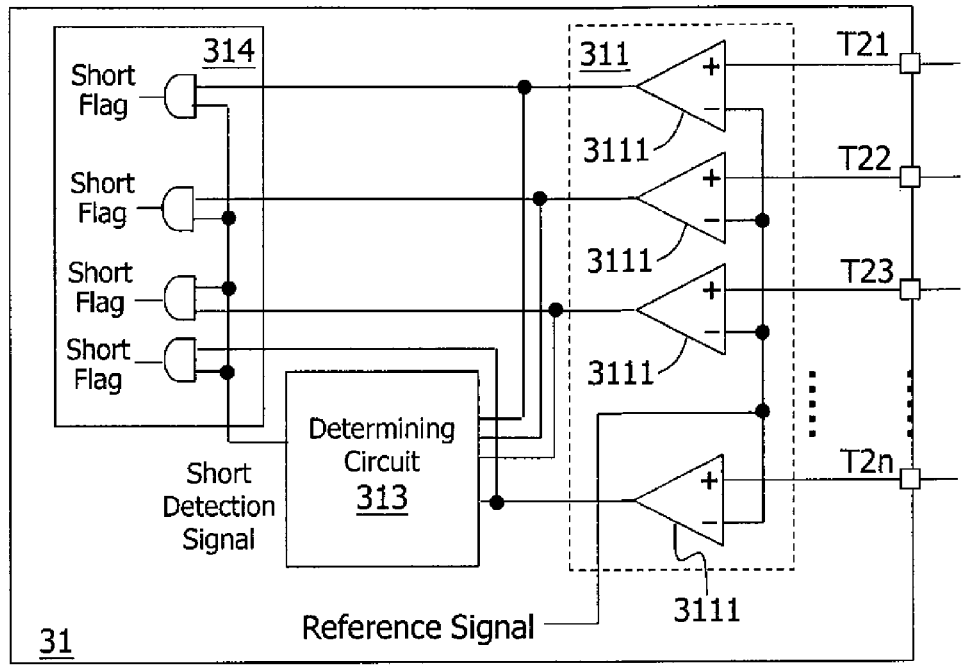
FIG. 7 shows the fourth embodiment of the present invention.

FIG. 7 shows the fourth embodiment of the present invention. In the foregoing embodiments, when any one or more LED strings are short-circuited, a single short detection signal is generated. In this embodiment, the short detection circuit 31 further includes a short flag generation circuit 314 which generates short circuit flags to respectively indicate whether corresponding LED strings are short-circuited. As shown in the figure, the short flag generation circuit 314 receives the short detection signal, and performs a logic operation between the short detection signal and the output of each comparator 3111. The short detection signal is equivalent to an enable signal for gating the output of each comparator 3111; thus, short flags are generated to indicate which LED string (or more than one LED strings) are short-circuited.

Figure 8:
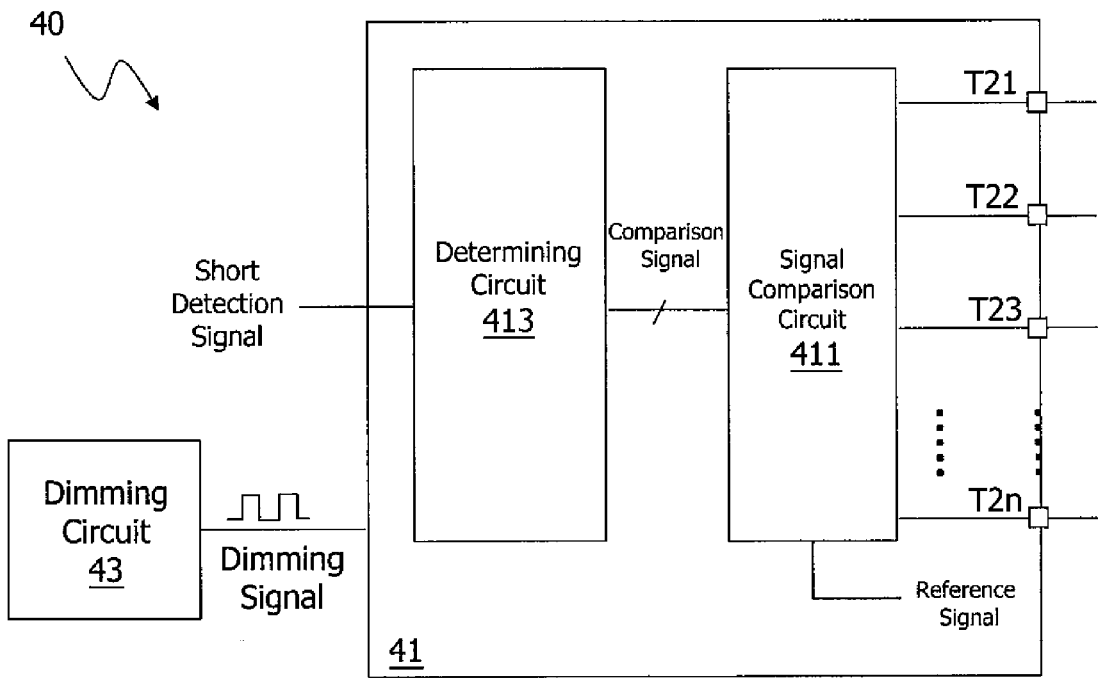
FIG. 8 shows the fifth embodiment of the present invention.

FIG. 8 shows the fifth embodiment of the present invention, wherein the light emitting device control circuit 40 further includes a dimmer circuit 43 to generate a dimming signal for controlling the brightness of the light emitting array 20 by turning ON and OFF the light emitting device strings. When the light emitting device strings are not turned ON by dimming signal, the short detection signal is not generated, or generated but not outputted. For example, a logic operation can be performed between the dimming signal and the short detection signal, or the dimming signal can be inputted to the signal comparison circuit 411 to stop the comparison, or the dimming signal can be inputted to the determining circuit 413 to stop the counting action.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, in the illustrated embodiments, a circuit or component which does not affect the main function can be inserted between two circuits or two devices shown to be in direct connection. As another example, it is not necessary for each comparator 3111 to receive the same reference signal; the comparators 3111 can receive to same or different reference signals. And, the light emitting device is not limited to the light emitting diode shown in the embodiments, but also can be any type of DC-controlled light emitting devices such as a light conductors. In another example, the light emitting device string can be reversely connected, that is, the supply voltage Vout is a negative voltage, and the negative terminals of the light emitting device strings are coupled to the supply voltage Vout, while the positive terminals of the light emitting device strings are coupled to the sensing nodes T21, T22, T23, ..., T2n. The circuit and signal processing should be modified accordingly. Furthermore, the positive and negative input terminals of the comparator 3111 can be interchanged, and in this case the low level of the output signal of the comparator 3111 will indicate the abnormal status (short circuit) of the LED string. In this case, the determining circuit 313 and the short flag generation circuit 314 should also be modified accordingly. As another well known example, a Smith trigger switches its output level according to the set threshold level, so if the threshold level of the Smith trigger is set to the reference value, the Smith trigger works equivalently to the comparator. Thus, the Smith trigger can be regarded as one form of a comparator. The scope of this creation should cover these and all other equivalent variations.

What is claimed is:

1. A light emitting device control circuit, controlling a light emitting array which includes a plurality of light emitting device strings, each light emitting device string having a first terminal and a second terminal and each light emitting device string including a plurality of light emitting devices connected in series, wherein the first terminals of the light emitting device strings are connected to a common node, the light emitting device control circuit comprising:
   a plurality of sensing nodes, respectively coupled to the second terminals of the light emitting device strings for receiving second terminal signals from the second terminals; and
   a short detection circuit coupled to the sensing nodes to receive the second terminal signals, for generating a plurality of comparison signals according to the second terminal signals and at least one reference signal, the short detection circuit counting a number of the comparison signals having a predetermined level and generating a short detection signal by determining whether or not the number of the comparison signals having the predetermined level is between a first setting value and a second setting value, wherein the first setting value is equal to or larger than 1, the second setting value is equal to or less than a total number of the light emitting device strings minus 1, the first setting value is less than the second setting value.

2. The light emitting device control circuit of claim 1, wherein the short detection circuit comprises:
   a signal comparison circuit, comparing each of the second terminal signals of the light emitting device strings and the at least one reference signal to generate the plurality of comparison signals; and
   a determining circuit, coupled to the signal comparison circuit and determining whether to generate the short detection signal according to the number of the comparison signals having the predetermined level.

3. The light emitting device control circuit of claim 1, wherein the short detection circuit further comprises a short flag generation circuit which generates respective short flags to indicate short circuit conditions of the light emitting device strings according to the short detection signal and the comparison signals.

4. The light emitting device control circuit of claim 1, further comprising a dimming circuit which generates a dimming signal to control a brightness of the light emitting array by turning ON and OFF the light emitting device strings, and the short detection circuit does not generate the short detection signal when the light emitting device strings are not turned ON.

5. A short detection circuit for detecting a short circuit condition of a light emitting array, the light emitting array including a plurality of light emitting device strings, each light emitting device string having a first terminal and a second terminal and each light emitting device string including a plurality of light emitting devices connected in series, wherein the first terminals of the light emitting device strings are connected to a common node, the short detection circuit comprising:
   a signal comparison circuit, comparing a second terminal signal from each second terminal of the plurality of light emitting device strings and at least one reference signal to generate a plurality of comparison signals corresponding to the plurality of light emitting device strings; and
   a determining circuit coupled to the signal comparison circuit, for counting a number of the comparison signals having a predetermined level and generating a short detection signal when the number of the comparison signals having the predetermined level is between a first setting value and a second setting value, wherein the first setting value is equal to or larger than 1, the second setting value is equal to or smaller than a total number of the light emitting device string minus 1, and the first setting value is smaller than the second setting value.

6. The short detection circuit of claim 5, wherein the short detection circuit further comprises a short flag generation circuit which generates respective short flags to indicate short circuit conditions of the light emitting device strings according to the short detection signal and the comparison signals.

7. The short detection circuit of claim 5, wherein the short detection circuit is for use in a light emitting device control circuit which comprises a dimming circuit, the dimming circuit generating a dimming signal to control a brightness of the light emitting array by turning ON and OFF the light emitting device strings, and the short detection circuit does not generate the short detection signal when the light emitting device strings are not turned ON.

* * * * *